(12) United States Patent
Ogawa et al.

(10) Patent No.: US 11,508,571 B2
(45) Date of Patent: Nov. 22, 2022

(54) FILM FORMING METHOD AND FILM FORMING APPARATUS

(71) Applicant: Tokyo Electron Limited, Tokyo (JP)

(72) Inventors: Jun Ogawa, Nirasaki (JP); Noriaki Fukiage, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 286 days.

(21) Appl. No.: 16/992,541

(22) Filed: Aug. 13, 2020

(65) Prior Publication Data

US 2021/0057207 A1 Feb. 25, 2021

(30) Foreign Application Priority Data

Aug. 20, 2019 (JP) .............................. JP2019-150612

(51) Int. Cl.
| | |
|---|---|
| *H01L 21/02* | (2006.01) |
| *C23C 16/458* | (2006.01) |
| *C23C 16/34* | (2006.01) |
| *C23C 16/52* | (2006.01) |
| *C23C 16/455* | (2006.01) |

(52) U.S. Cl.
CPC ........ *H01L 21/0217* (2013.01); *C23C 16/345* (2013.01); *C23C 16/4588* (2013.01); *C23C 16/45502* (2013.01); *C23C 16/52* (2013.01); *H01L 21/022* (2013.01); *H01L 21/0228* (2013.01)

(58) Field of Classification Search
None
See application file for complete search history.

(56) References Cited

U.S. PATENT DOCUMENTS

2019/0051512 A1* 2/2019 Kato ................. H01L 21/02274

FOREIGN PATENT DOCUMENTS

JP 2019-33229 A 2/2019

* cited by examiner

*Primary Examiner* — Asok K Sarkar
(74) *Attorney, Agent, or Firm* — Nath, Goldberg & Meyer; Jerald L. Meyer; Tanya E. Harkins

(57) ABSTRACT

A film forming method includes: rotating a rotary table to revolve a substrate which is placed on the rotary table and has a recess in its surface; supplying a raw material gas to a first region on the rotary table; supplying an ammonia gas to a second region on the rotary table; forming a first SiN film in the recess by supplying the raw material gas to the first region and supplying the ammonia gas to the second region at a first flow rate, while the rotary table rotates at a first rotation speed; and forming a second SiN film in the recess such that the second SiN film is laminated on the first SiN film by supplying the raw material gas to the first region and supplying the ammonia gas to the second region at a second flow rate, while the rotary table rotates at a second rotation speed.

7 Claims, 10 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2019-150612, filed on Aug. 20, 2020, the entire contents of which are incorporated herein by reference.

TECHNICAL FIELD

The present disclosure relates to a film forming method and a film forming apparatus.

BACKGROUND

In a semiconductor-manufacturing process, a silicon nitride (SiN) film may be formed so as to be embedded in a recess formed in the surface of a semiconductor wafer (hereinafter, referred to as a "wafer"), which is a substrate. The SiN film may be formed by performing atomic layer deposition (ALD) such that a raw material gas containing silicon and ammonia gas turned into plasma are alternately supplied to the wafer.

Patent Document 1 discloses a film forming apparatus including a rotary table configured to revolve a wafer mounted thereon, gas nozzles configured to respectively supply a raw material gas and an ammonia gas to different areas on the rotary table, and a plasma generator configured to turn the supplied ammonia gas into plasma. In this film forming apparatus, the atmospheres in the regions to which the raw material gas and the ammonia gas are respectively supplied are separated from each other by a separation gas supplied from a separation gas nozzle, and a film is formed by ALD such that a SiN film is embedded in a recess in the wafer surface.

PRIOR ART DOCUMENT

Patent Document

Patent Document 1: Japanese Laid-Open Patent Publication No. 2019-33229

SUMMARY

According to the present disclosure, there is provided a film forming method including: rotating a rotary table to revolve a substrate which is placed on the rotary table and has a recess formed in a surface of the substrate; supplying a raw material gas containing silicon to a first region on the rotary table; supplying an ammonia gas to a second region which is spaced apart from the first region on the rotary table in a rotation direction of the rotary table and has an atmosphere partitioned from the first region; forming a first silicon nitride film in the recess by supplying the raw material gas to the first region and supplying the ammonia gas to the second region at a first flow rate, while the rotary table rotates at a first rotation speed; and forming a second silicon nitride film in the recess such that the second silicon nitride film is laminated on the first silicon nitride film by supplying the raw material gas to the first region and supplying the ammonia gas to the second region at a second flow rate smaller than the first flow rate, while the rotary table rotates at a second rotation speed smaller than the first rotation speed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
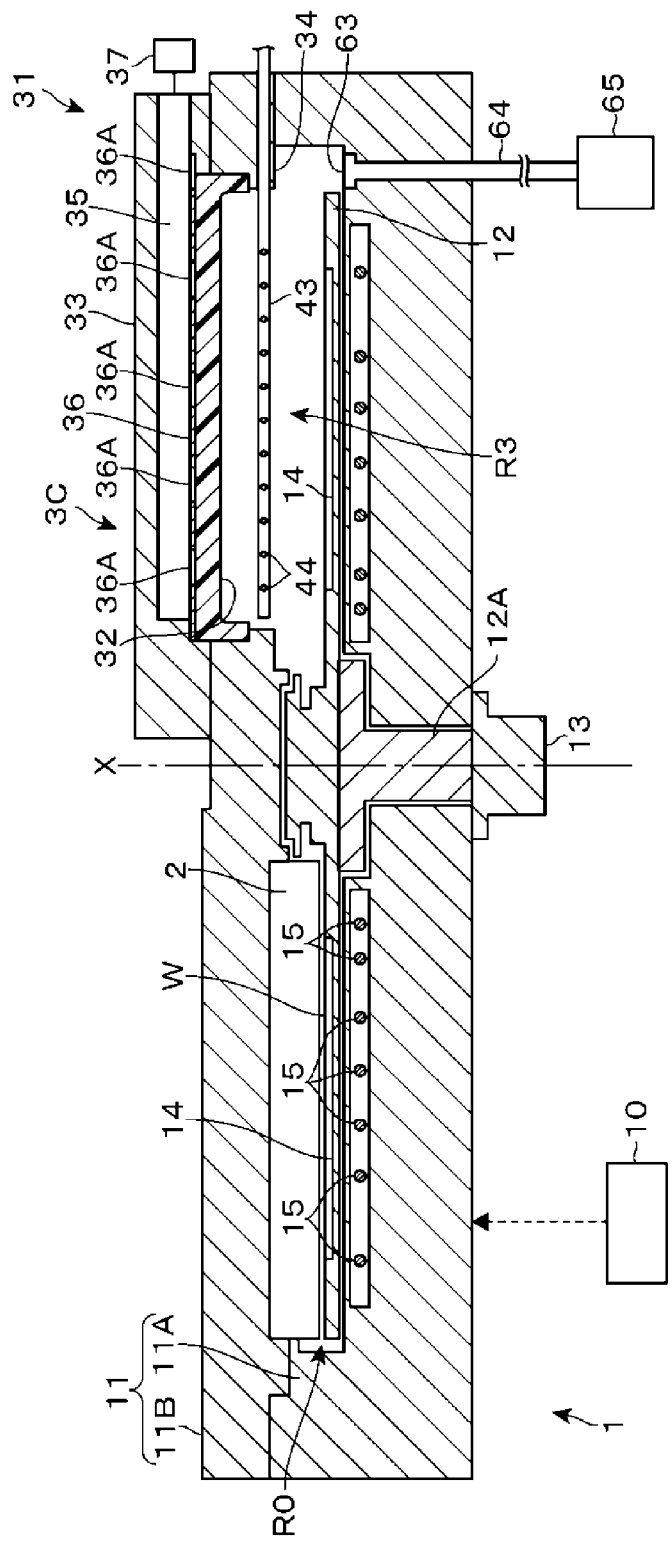
FIG. 1 is a vertical cross-sectional view of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 according to an embodiment of the present disclosure will be described with reference to a vertical cross-sectional view of FIG. 1 and a horizontal cross-sectional view of FIG. 2. The film forming apparatus 1 performs ALD in which, for example, a dichlorosilane (DCS: $SiH_2Cl_2$) gas as a raw material gas containing silicon and an ammonia gas ($NH_3$) turned into plasma (plasmarized) as a nitriding gas for nitriding silicon are alternately supplied to a wafer W so as to form a SiN film on the wafer W. In this specification, silicon nitride is referred to as SiN regardless of the stoichiometric ratio between silicon and nitrogen. Accordingly, the description of SiN includes, for example, $Si_3N_4$.

The film forming apparatus 1 includes a flat and substantially circular vacuum chamber (processing chamber) 11, and the vacuum chamber 11 includes a chamber body 11A configuring a side wall and a bottom of the vacuum chamber 11, and a ceiling plate 11B. In the drawing, reference numeral 12 denotes a circular rotary table installed in a horizontal posture in the vacuum chamber 11. In the drawing, reference numeral 12A is a support that supports the center of a rear surface of the rotary table 12. In the drawing, reference numeral 13 denotes a rotary mechanism that rotates the rotary table 12 clockwise in a plan view along the circumferential direction of the rotary table 12 via the support 12A. In addition, X in the drawing represents a rotary axis of the rotary table 12.

Six circular recesses 14 are formed in a top surface of the rotary table 12 along the circumferential direction (rotation direction) of the rotary table 12, and a wafer W is accommodated in each recess 14. That is, each wafer W is mounted on the rotary table 12 so as to revolve by the rotation of the rotary table 12. In addition, reference numeral 15 in FIG. 1 denotes heaters. A plurality of heaters 15 is concentrically installed in a bottom portion of the vacuum chamber 11 and heats the wafers W placed on the rotary table 12. In FIG. 2, reference numeral 16 denotes a transport port of the wafer W opened in the side wall of the vacuum chamber 11, and the transport port 16 is configured to be capable of being opened and closed by a gate valve (not illustrated). The wafer W is delivered between the exterior of the vacuum chamber 11 and the interior of each recess 14 through the transport port 16 by a substrate transport mechanism (not illustrated).

Above the rotary table 12, a shower head 2, a plasma forming unit 3A, a plasma forming unit 3B, and a plasma forming unit 3C are installed in this order to be spaced apart from each other along the rotation direction of the rotary table 12 toward the downstream side in the rotation direction. The shower head 2 supplies the DCS gas. The plasma forming units 3A to 3C turn the gases, which are supplied from respective gas injectors 41 to 43 installed to correspond to the plasma forming units 3A to 3C, into plasma. The injectors 41 to 43 will be described later. Specifically, the plasma forming units 3A and 3B turn, for example, a hydrogen (H$_2$) gas into plasma so as to modify the SiN film, and the plasma forming unit 3C turns the above-described nitriding gas of silicon, NH$_3$ gas, into plasma.

Figure 3:
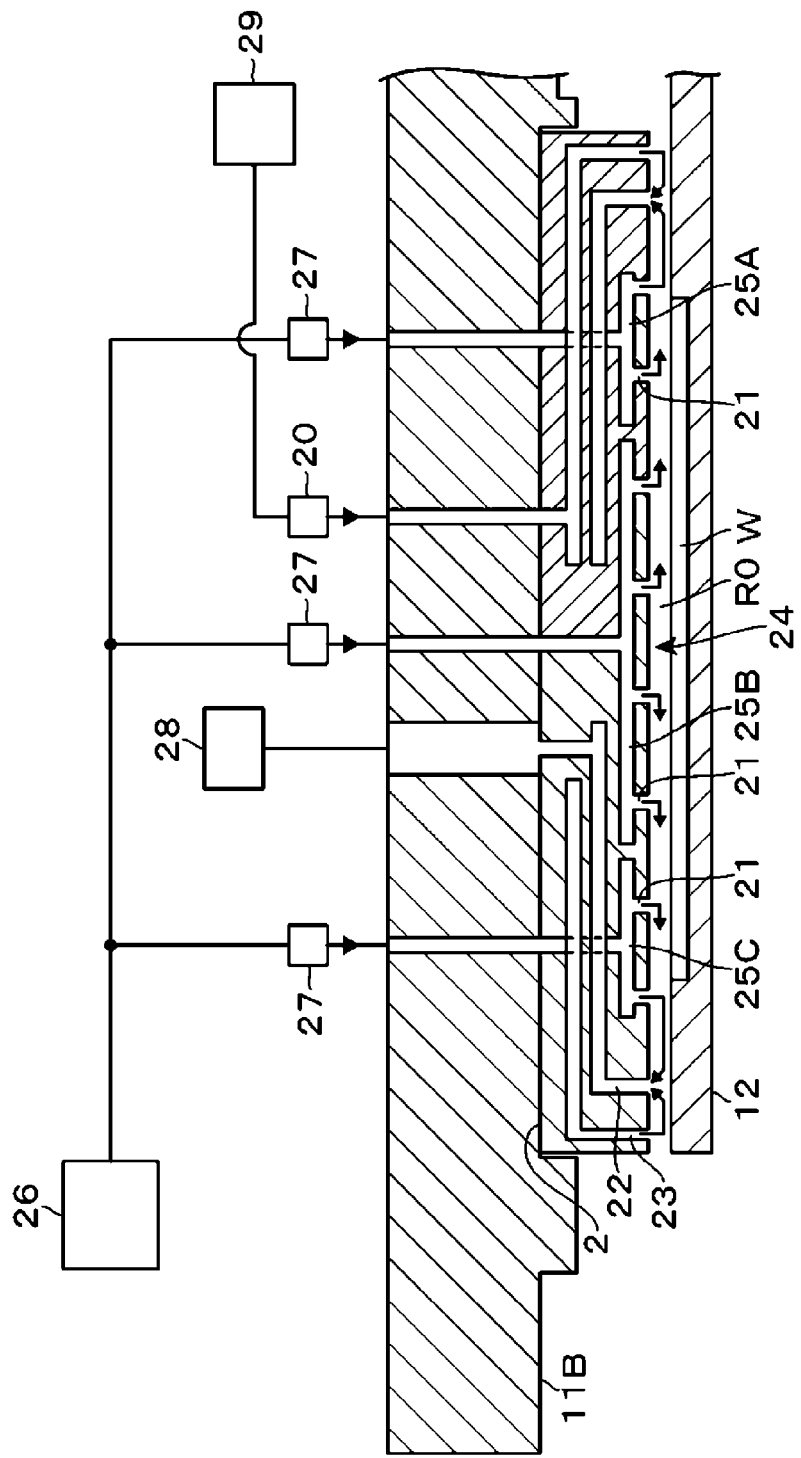
FIG. 3 is a vertical cross-sectional view of a shower head.
Figure 4:
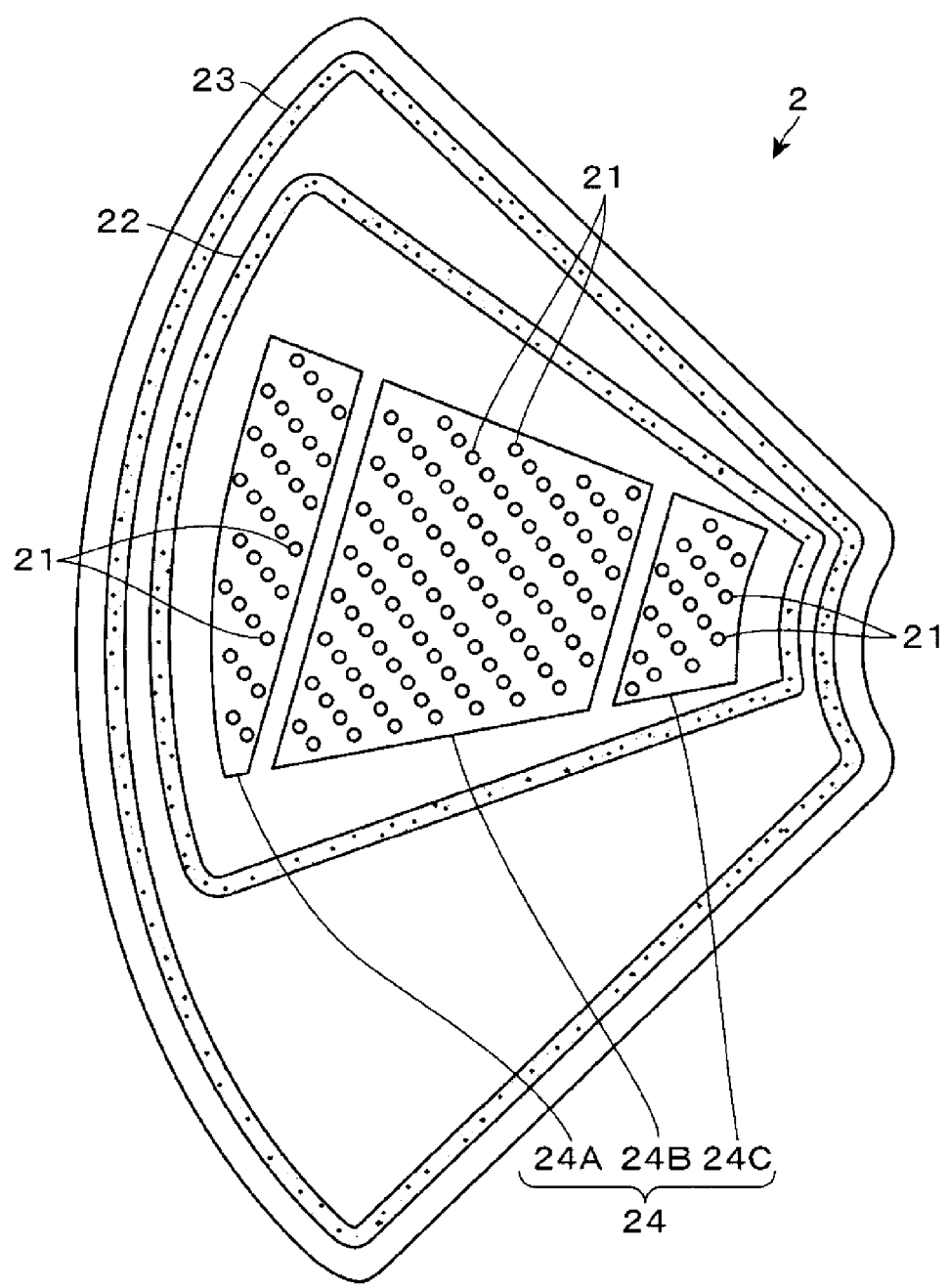
FIG. 4 is a bottom view of the shower head installed in the film forming apparatus.

The shower head 2, which is a raw material gas supply part, will be described with reference to FIG. 3 which is a vertical cross-sectional side view and FIG. 4 which is a bottom view. The shower head 2 is formed in a fan shape which widens in the circumferential direction of the rotary table 12 from the center side of the rotary table 12 towards the peripheral side in a plan view, and a bottom surface of the shower head 2 is close to and faces the top surface of the rotary table 12. In the bottom surface of the shower head 2, gas discharge ports 21, an exhaust port 22, and a purge gas discharge port 23 are opened. For easy identification, the exhaust port 22 and the purge gas discharge port 23 are indicated by a large number of dots in FIG. 4. The exhaust port 22 is connected to an exhaust device 28, and thus the exhaust from the exhaust port 22 is adjusted by the exhaust device 28. The purge gas discharge port 23 is connected to a purge gas supply source 29 via a pipe, and a gas supply device 20 including a valve and a mass flow controller is installed in the pipe. By the gas supply device 20, a supply/stop of the purge gas to the downstream side of the pipe and a flow rate adjustment of the purge gas are performed. A large number of the gas discharge ports 21 are arranged in a fan-shaped region 24 on the inner side of the peripheral edge of the bottom surface of the shower head 2. The gas discharge ports 21 eject the DCS gas downwards in the form of a shower during the rotation of the rotary table 12, and are opened such that the DCS gas is supplied to the entire surface of the wafer W.

In the fan-shaped region 24, three zones 24A, 24B and 24C are set from the center side of the rotary table 12 towards the peripheral side of the rotary table 12. The shower head 2 is installed with gas flow paths 25A, 25B, and 25C partitioned from each other such that the DCS gas can be independently supplied to the gas discharge ports 21 provided in the respective zones 24A, 24B, and 24C. The upstream side of each of the gas flow paths 25A, 25B and 25C is connected to a DCS gas supply source 26 via a pipe, and a gas supply device 27 including a valve and a mass flow controller is installed in each pipe. By the gas supply device 27, a supply/stop of the DCS gas to the downstream side of the pipe and a flow rate adjustment of the DCS gas are performed.

The exhaust port 22 and the purge gas discharge port 23 are annularly opened in the peripheral edge of the bottom surface of the shower head 2 so as to face the top surface of the rotary table 12 while surrounding the fan-shaped region 24, and the purge gas discharge port 23 are located outside the exhaust port 22 so as to surround the exhaust port 22. The region inside the exhaust port 22 on the rotary table 12 forms an adsorption region R0 which is a first region where the DCS is adsorbed to the wafer W. The purge gas discharge port 23 ejects, for example, Ar (argon) gas as a purge gas onto the rotary table 12.

Next, the plasma forming unit 3C will be described with reference to FIGS. 1 and 2. The plasma forming unit 3C supplies microwaves to NH$_3$ gas ejected below the plasma forming unit 3C so as to generate plasma on the rotary table 12. The plasma forming unit 3C includes an antenna 31 for supplying the microwaves, and the antenna 31 includes a dielectric plate 32 and a metal waveguide 33.

The dielectric plate 32 is formed in a substantially fan shape that widens from the center side of the rotary table 12 towards the peripheral side of the rotary table 12 in a plan view. The ceiling plate 11B of the vacuum chamber 11 has a substantially fan-shaped through-hole corresponding to the shape of the dielectric plate 32, and the inner peripheral surface of the lower end portion of the through-hole slightly protrudes towards the center of the through-hole to form a support portion 34. The dielectric plate 32 closes this fan-shaped through-hole from the upper side and faces the rotary table 12, and the peripheral edge of the dielectric plate 32 is supported on the support portion 34.

The waveguide 33 is installed on the dielectric plate 32, and includes an inner space 35 extending above the ceiling plate 11B. In the figure, reference numeral 36 denotes a slot plate constituting the bottom portion of the waveguide 33. The slot plate 36 has a plurality of slot holes 36A and is installed in contact with the dielectric plate 32. An end portion of the waveguide 33 near the center of the rotary table 12 is closed, and a microwave generator 37 configured to supply microwave of about 2.35 GHz to the waveguide 33 is connected to an end portion of the waveguide 33 near the periphery of the rotary table 12. The microwave passes through the slot holes 36A in the slot plate 36, reaches the dielectric plate 32, and is supplied to a plasma forming gas supplied below the dielectric plate 32. Thus, plasma is limitedly formed below the dielectric plate 32, and the wafer W is processed. As described above, a region below the dielectric plate 32 is configured as a plasma forming region forming a second region, and is indicated as R3. The plasma forming units 3A and 3B are configured similarly to the plasma forming unit 3C, and regions corresponding to the plasma forming region R3 in the plasma forming units 3A and 3B are indicated as plasma forming regions R1 and R2, respectively.

Hereinafter, a description will be made with reference to FIG. 5, which is a schematic vertical cross-sectional view taken along the rotation direction of the rotary table 12. A gas injector 41, a gas injector 42, and a gas injector 43 that extend along the radial direction of the rotary table 12 in a plan view are installed below the plasma forming regions R1, R2, and R3, respectively. Each of the gas injectors 41 to 43 is an elongated tube, which is closed at the front end side thereof. The front end of each of the gas injectors 41 to 43 extends laterally from the side wall of the vacuum chamber 11 towards the center, and a large number of discharge ports 44 are formed along the extension direction. Each discharge port 44 ejects gas in the lateral direction.

When viewed in the rotation direction of the rotary table 12, the gas injector 41 is located closer to the downstream side of the plasma forming region R1 and ejects $H_2$ gas towards the upstream side of the plasma forming region R1. Similarly, when viewed in the rotational direction, the gas injector 42 is located closer to the upstream side of the plasma forming region R2, and ejects $H_2$ gas towards the downstream side of the plasma forming region R2, and the gas injector 43 is located closer to the downstream of the plasma forming region R3, and ejects $NH_3$ gas towards the upstream side of the plasma forming region R3.

Figure 6:
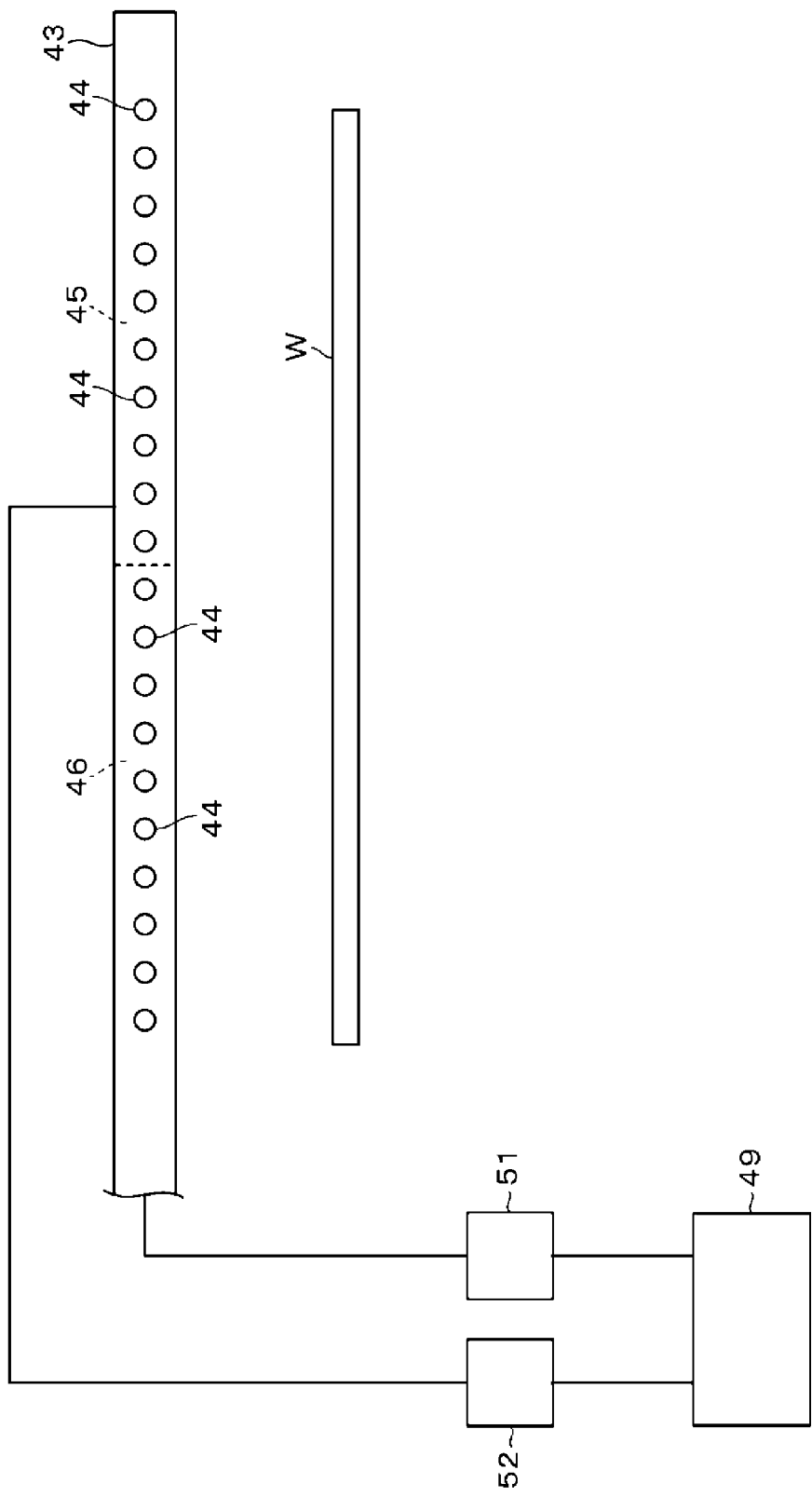
FIG. 6 is a view illustrating the configuration of a gas injector installed in the film forming apparatus.

The gas injector 43 that constitutes an ammonia gas supply part will be described with reference to FIG. 6. Inside the gas injector 43, a front-end-side flow path 45 connected to a plurality of discharge ports 44 on the front end side of the gas injector 43, and a base-end-side flow path 46 connected to a plurality of discharge ports 44 on the base end side of the gas injector 43 are provided. The front-end-side flow path 45 and the base-end-side flow path 46 are partitioned from each other. The front-end-side flow path 45 and the base-end-side flow path 46 are connected to an $NH_3$ gas supply source 49 via pipes that are installed with gas supply devices 51 and 52, respectively. Similar to the gas supply device 27, each of the gas supply devices 51 and 52 includes a valve and a mass flow controller. That is, a pipe system is configured such that the flow rate of $NH_3$ gas supplied to each of the front-end-side flow path 45 and the base-end-side flow path 46 can be individually adjusted.

The gas injectors 41 and 42 are configured similarly to the gas injector 43, and are connected to a $H_2$ gas supply source 53 via pipes. Therefore, in each of the gas injectors 41 and 42, a gas supply device 51 for supplying gas to the front-end-side flow path 45 and a gas supply device 52 for supplying gas to the base-end-side flow path 46 are also installed. In FIG. 2, in order to avoid complication of the drawing, only the gas supply device 51 is illustrated. In addition, regarding each of the gas supply devices described above, the supply/stop of gas to the downstream side of the pipe and the flow rate adjustment of the gas are performed based on a control signal output from the controller 10 described later.

Figure 2:
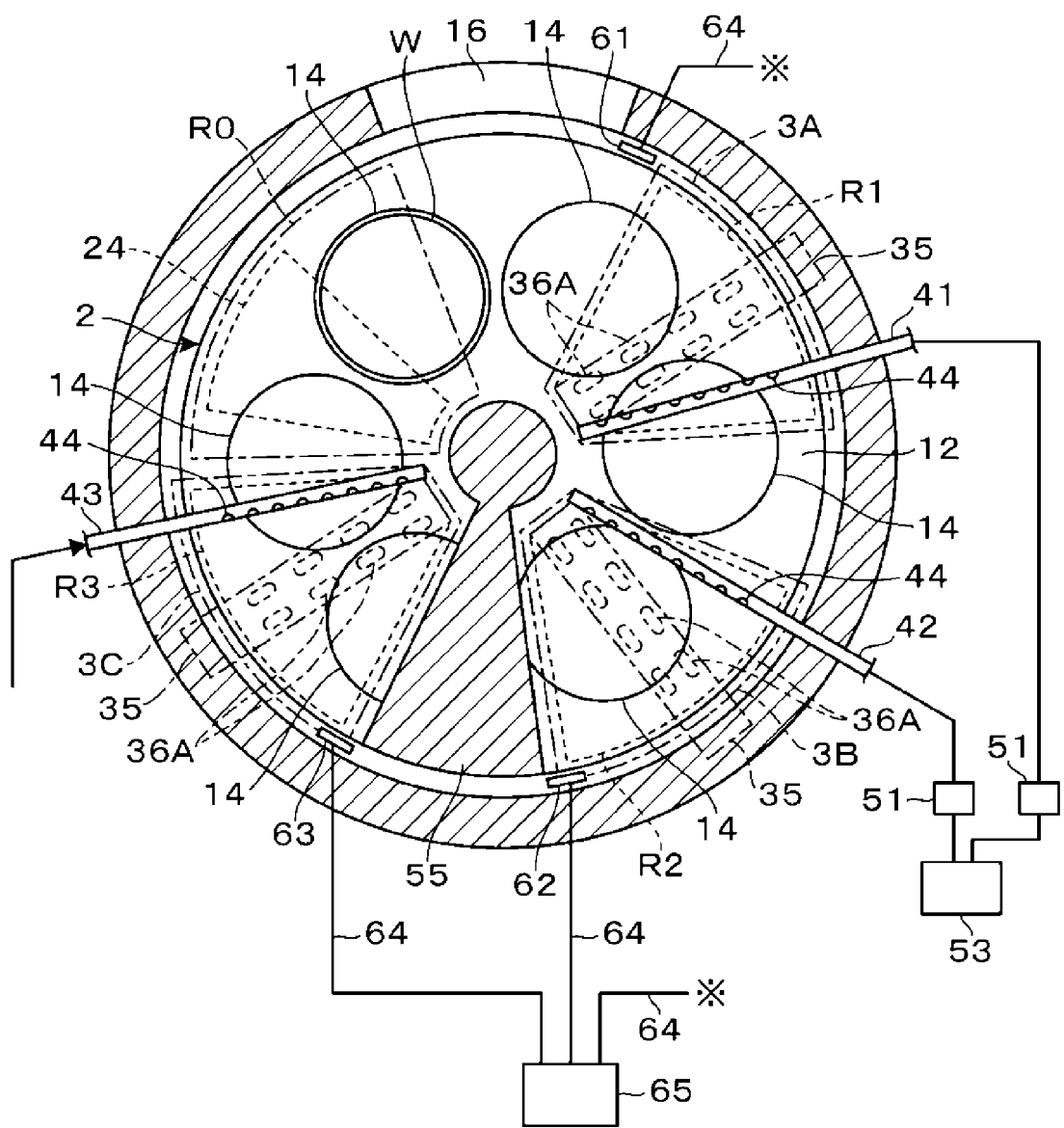
FIG. 2 is a horizontal cross-sectional view of the film forming apparatus.
Figure 5:
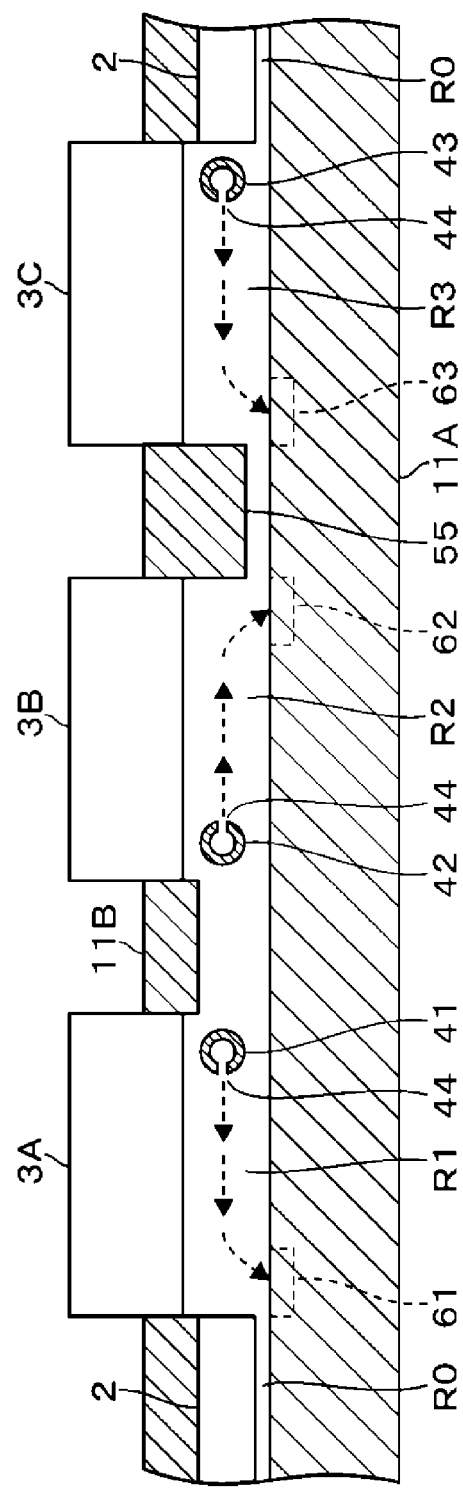
FIG. 5 is a horizontal cross-sectional view of the film forming apparatus.

As illustrated in FIGS. 2 and 5, a separation region 55 is installed between the plasma forming regions R2 and R3 in the rotation direction of the rotary table 12. The separation region 55 has a ceiling surface lower than that of the plasma forming regions R2 and R3, and is formed in a fan shape that expands in the rotation direction of the rotary table 12 from the center side of the rotary table 12 towards the peripheral side of the rotary table 12 in a plan view. Since the separation region 55 has the low ceiling surface as described above, the separation region 55 suppresses the gas flow between the plasma forming regions R2 and R3.

Exhaust ports 61 to 63 are formed in the bottom portion of the chamber body 11A (only the exhaust port 63 is illustrated in FIG. 1). In addition, as illustrated in FIG. 2, the exhaust ports 61 to 63 are opened outside the rotary table 12 and opened at a position facing the upstream-side edge of the first plasma forming region R1, a position facing the downstream-side edge of the second plasma forming region R2, and a position facing the upstream-side edge of the plasma forming region R3, respectively. Since the exhaust ports 61 to 63 are opened in this way, the exhaust port 61, the exhaust port 62, and the exhaust port 63 exhaust the gases ejected from the gas injector 41, the gas injector 42, and the gas injector 43, respectively. The exhaust ports 61 to 63 are connected to an exhaust device 65 via respective exhaust pipes 64, each of which is provided with an adjuster (not illustrated) for adjusting the exhaust amount, and thus the exhaust amount from each of the exhaust ports 61 to 63 is adjusted by the adjuster.

As illustrated in FIG. 1, the film forming apparatus 1 is provided with a controller 10 configured with a computer, and the controller 10 stores a program. With respect to this program, a group of steps is assembled such that a control signal is transmitted to each part of the film forming apparatus 1 so as to control the operation of each part and the film forming process of a SiN film described below is executed. Specifically, for example, the rotation speed of the rotary table 12 rotated by the rotary mechanism 13, the operation of each gas supply device, the amount of exhaust gas from each of the exhaust ports 61 to 63, the supply/stop of microwaves from the microwave generator 37 to the antenna 31, and power supply to the heater 15 are controlled by the program. The control of power supply to the heater 15 is the control of the temperature of a wafer W, and the control of the amount of exhaust gas from the exhaust ports 61 to 63 is the control of the pressure within the vacuum chamber 11. This program is stored in a storage medium such as a hard disc, a compact disc, a DVD, or a memory card, and is installed in the controller 10.

Figure 7:
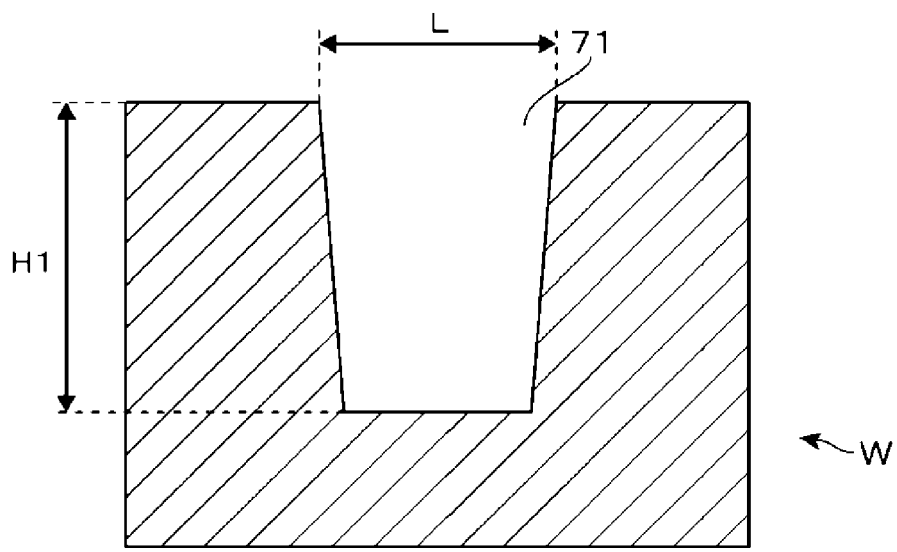
FIG. 7 is a vertical cross-sectional view of a wafer processed by the film forming apparatus.
Figure 9:
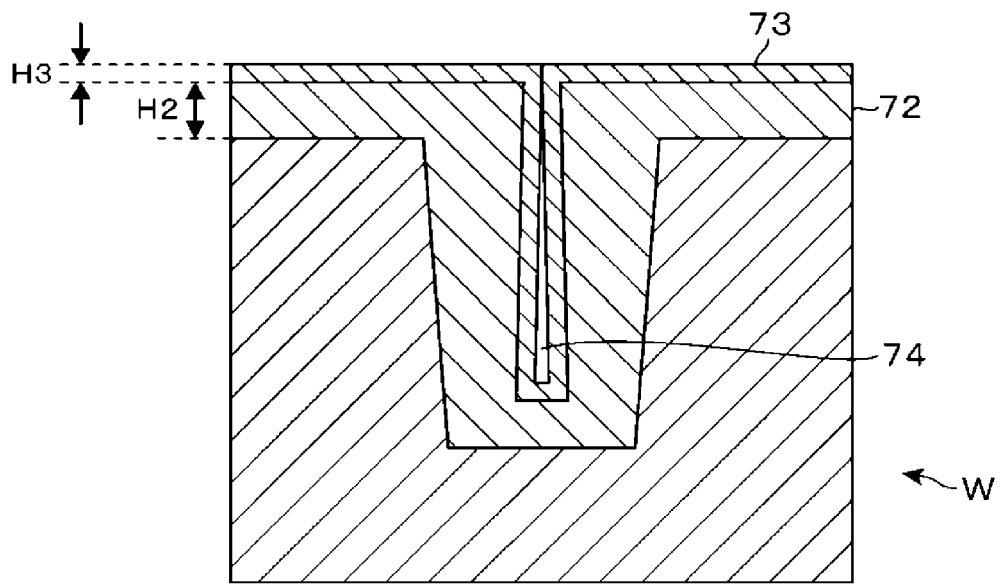
FIG. 9 is a vertical cross-sectional view of the wafer.
Figure 10:
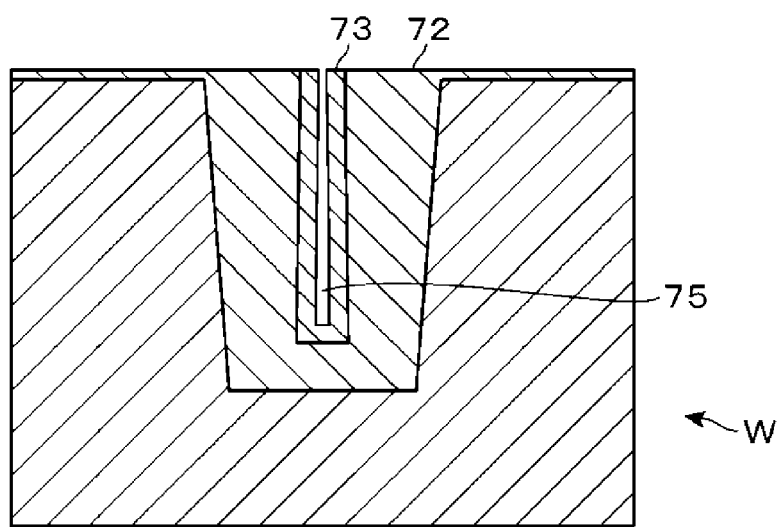
FIG. 10 is a vertical cross-sectional view of the wafer.
Figure 11:
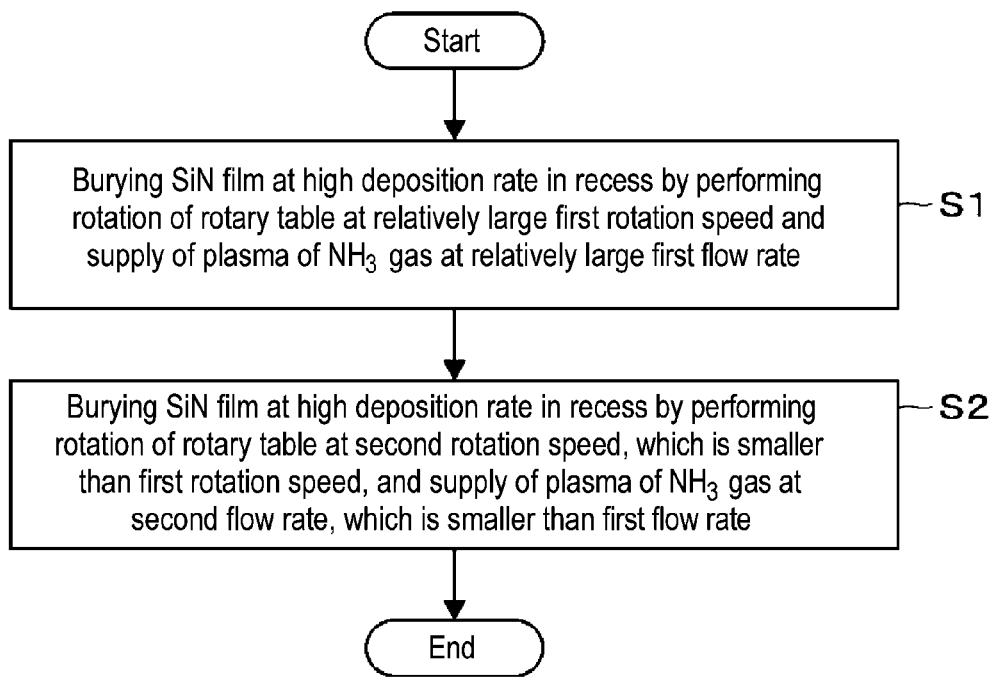
FIG. 11 is a flowchart illustrating of an embodiment of a film forming method performed by the film forming apparatus.

Hereinafter, a process of forming a SiN film, performed by the film forming apparatus 1 will be described below with reference to FIGS. 7 to 10, which are vertical cross-sectional views of a wafer W, and FIG. 11, which is a flowchart of the operation of the film forming apparatus 1. FIG. 7 shows an exemplary wafer W transported to the film forming apparatus 1. For example, a plurality of recesses (of which only one is illustrated in the drawing) 71 is formed in the surface of the wafer W as a pattern. In this film forming process, film formation is performed such that the recess 71 is filled with a SiN film. The recess 71 has an aspect ratio (depth H1/opening width L) of, for example, 2 to 30.

First, the outline of a film forming process will be described. In this film forming process, the rotation of the rotary table 12 causes a wafer W to revolve, and the supply of DCS gas and the supply of plasma of $NH_3$ gas are alternately performed to the wafer W. In forming a film in this way, as shown in an evaluation test described later, when the rotation speed of the rotary table 12 is relatively small and the flow rate of the $NH_3$ gas is relatively small, the formed SiN films may be have a low wet etching rate (WER) and a good film quality. However, when the rotation speed of the rotary table 12 is small, the number of cycles including the supply of DCS gas and the supply of plasma of $NH_3$ gas per unit time becomes small, and thus the deposition rate (the speed of increasing film thickness) of the SiN film becomes small. Further, when the flow rate of the NH$_3$ gas is relatively small, the amount of nitrogen supplied to the wafer W for forming the SiN film becomes small, and thus the deposition rate becomes small, too. As described above, for the SiN film, the low WER (good film quality) and the high deposition rate are in a trade-off relationship. In consideration of the fact that the WER is affected by the amount of NH groups (imino groups) contained in the SiN film, the reason why the WER becomes small when the flow rate of the NH$_3$ gas is small as described above is because, when the flow rate of the NH$_3$ gas is small, the amount of the NH groups in the SiN film becomes small. The WER referred to here is the WER when the SiN film is immersed in an etching liquid including a compound containing fluorine, such as hydrogen fluoride.

Then, as will be described later with reference to the drawings, minute voids may remain in the SiN film embedded in the recess 71 when the film formation is performed as described above. When the wet etching liquid is supplied to the wafer W after the voids are opened as recesses on the surface of the wafer W by peeling off the surface layer of the wafer W in the process subsequent to the film formation, the wet etching liquid enters the recesses. When the above-described SiN film having a good film quality is formed on the inner walls of the recesses, it is possible to prevent the recesses from expanding due to etching even if the wet etching liquid enters the recesses as described above. That is, it is possible to prevent unnecessary etching of the SiN film. However, since the deposition rate when forming a SiN film having a good film quality is small as described above. Thus, if the film forming process is performed under the processing conditions for obtaining the good film quality, the process will take a long time from the start to the end of filling the recess 71.

Therefore, in this film forming process, first, formation of the SiN film is performed under the processing conditions in which the rotation speed of the rotary table 12 is high and the flow rate of NH$_3$ is large, that is, under the processing conditions in which a high deposition rate can be obtained. Thereafter, before the recess 71 is closed, switching to the conditions, in which the rotation speed of the rotary table 12 is low and the flow rate of NH$_3$ is small, that is, switching to the processing conditions, in which the WER of the SiN film becomes low, is performed so as to close the recess 71. That is, even if the voids are formed in the SiN film, film formation is performed such that the SiN film formed around the voids have a good film quality. For convenience of description, FIG. 9 described later shows the state in which a SiN film is formed in the recess 71 such that a void is formed.

The procedure of a film forming process will be specifically described below. First, six wafers W illustrated in FIG. 7 are placed in the recesses 14 of the rotary table 12. Then, the gate valve installed at the transport port 16 in the vacuum chamber 11 is closed to hermetically seal the inside of the vacuum chamber 11, and the wafers W are heated to, for example, 250 degrees C. to 600 degrees C., more specifically, for example, 550 degrees C. by the heaters 15. Then, by exhausting from the exhaust ports 61 to 63, the interior of the vacuum chamber 11 is turned into a vacuum atmosphere of, for example, 66.7 Pa to 667 Pa, and the rotary table 12 is rotated at a first rotation speed of, for example, 10 rpm or more, more specifically, for example, 20 rpm to 30 rpm, whereby each wafer W revolves.

The shower head 2 supplies the DCS gas from the gas discharge ports 21 to the adsorption region R0. In addition, in the shower head 2, the Ar gas is discharged from the purge gas discharge port 23, and the exhaust from the exhaust port 22 is performed, whereby the atmosphere of the adsorption region R0 is partitioned from the atmospheres of the plasma forming regions R1 to R3. Meanwhile, the H$_2$ gas is supplied from the gas injectors 41 and 42, and microwaves are supplied to the plasma forming regions R1 and R2 by the plasma forming units 3A and 3B, whereby the plasma of the H$_2$ gas is formed in the plasma forming regions R1 and R2. In addition, for example, 1000 sccm of the NH$_3$ gas is supplied to each of the front-end-side flow path 45 and the base-end-side flow path 46 of the gas injector 43, and the NH$_3$ gas is supplied from the gas injector 43 at a first flow rate of 2000 sccm in total. Then, microwaves are supplied to the plasma forming region R3 by the plasma forming unit 3C, and thus the plasma of the NH$_3$ gas is formed in the plasma forming region R3 (step S1 in FIG. 11).

Figure 8:
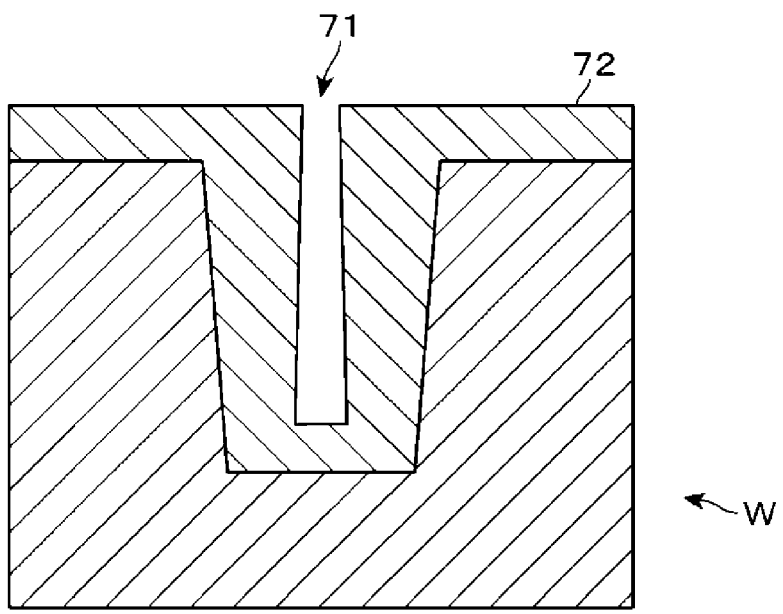
FIG. 8 is a vertical cross-sectional view of the wafer.

By revolving the wafers W, the wafers W repeatedly pass through the adsorption region R0 and the plasma forming regions R1, R2, and R3, to which respective gases are sequentially supplied as described above. The DCS gas is adsorbed on the surfaces of the wafers W in the adsorption region R0, and the silicon in the adsorbed DCS is nitrided by the plasma of NH$_3$ gas in the plasma forming region R3 to form a SiN film 72 along the surfaces of the wafers W. In the plasma forming regions R1 and R2, the SiN film 72 is modified by the plasma of the H$_2$ gas. Specifically, H is bonded to dangling bonds in SiN, Cl is removed from the deposited SiN, whereby the SiN becomes dense and has a low content of impurities. By continuing the revolution of the wafers W, the thickness of the SiN film 72 increases (FIG. 8). As described above, since the rotation speed of the wafers W is relatively large and the flow rate of the supplied NH$_3$ gas is relatively large, the speed of increasing the thickness of the SiN film 72 is relatively large and the opening width of the recess 71 is reduced due to the increase of the film thickness.

When the rotary table 12 is rotated a predetermined number of times after respective gases are supplied to the adsorption region R0 and the plasma forming regions R1 to R3, the rotation speed of the rotary table 12 is reduced to a second rotation speed, for example, 5 rpm or less, more specifically, for example, 1 pm. In addition, while the rotation speed is reduced in this way, the flow rate of the NH$_3$ gas supplied to each of the front-end-side flow path 45 and the base-end-side flow path 46 of the gas injector 43 is reduced, for example, 100 sccm of the NH$_3$ gas is supplied to each of the front-end-side flow path 45 and the base-end-side flow path 46, and the NH$_3$ gas is ejected from the gas injector 43 at a second flow rate of 200 sccm in total (step S2). In this way, the recess 71 is not closed by the SiN film 72 at the timing at which the rotation speed of the rotary table 12 and the flow rate of the NH$_3$ gas are changed. The supply of the DCS gas to the adsorption region R0 and the plasma formation of the H$_2$ gas in the plasma forming regions R1 and R2 are continuously performed, and the formation of the SiN film on the wafers W and the modification of the SiN film are continued. In this way, the SiN film after the change of the processing conditions is indicated by reference numeral 73 to be distinguished from the SiN film 72 formed before the change of the processing conditions. Therefore, the SiN film 73 that is a second SiN film is formed on the entire surface of each wafer W including the inside of the recess 71 by being laminated on the SiN film 72 that is a first SiN film.

As described above, since the rotation speed of the rotary table 12 is relatively small and the flow rate of the supplied NH$_3$ gas is relatively small, the speed of increasing the thickness of the SiN film 73 is relatively small and thus the film quality of the SiN film 73 is good. Due to the increase in the thickness of the SiN film 73, the width of the recess 71 is further narrowed. Then, for example, the upper portion of the recess 71 is closed earlier than the lower portion of the recess 71, and the recess 71 is closed leaving a minute void 74. When the rotary table 12 is rotated a predetermined number of times after changing the rotation speed of the rotary table 12 and the flow rate of the $NH_3$ gas, the supply of respective gases to the adsorption region R0 and the plasma forming regions R1 to R3 and the supply of microwaves to R1 to R3 are stopped, and the film forming process is stopped. FIG. 9 illustrates the wafer W when the film forming process is stopped in such a manner, and the SiN film 72 is formed such that the thickness H3 of the SiN film 73 becomes smaller than the film thickness H2 of the SiN film 72 in order to prevent the process time of the film formation from being increased. The thickness H3 is, for example, 20 nm or less.

The wafer W that has been subjected to the film forming process is unloaded from the processing chamber 11, and is subjected to a process including the removal of the surface layer portion of the wafer W by, for example, CMP, and the subsequent wet etching as described above. The polishing by the CMP is performed so as to reach the upper portion of the void 74, and the void 74 is opened as a recess 75 on the surface of the wafer W as illustrated in FIG. 10. Even though it is assumed that the etching liquid has entered the recess 75 in the wet etching, since the inner wall of the recess 75 is formed of the SiN film 73 having a good film quality, the etching of the inner wall by the etching liquid is suppressed.

With the film forming apparatus 1, the SiN film 72 is formed at a high deposition rate in the first step (Step S1) in which the rotation speed of the rotary table 12 is large and the flow rate of the $NH_3$ supplied to the wafer W is large. Subsequently, the SiN film 73 is formed in the second step (Step S2) of lowering the rotation speed of the rotary table 12 and lowering the flow rate of the $NH_3$ supplied to the wafer W compared with the first step. By performing the film formation in this manner, it is possible to prevent the film forming time required to fill the recess 71 of the wafer W with the SiN film from being increased. Further, even if the void 74 remains in the SiN film embedded in the recess 71, wet etching of the SiN film forming the inner wall of the recess 75 formed from the void 74 is suppressed. Accordingly, it is possible to suppress a decrease in the throughput of the film forming process for burying the SiN film in the recess 71 and to suppress a decrease in the yield of semiconductor products manufactured from the wafer W.

The first flow rate of the $NH_3$ gas supplied into the processing chamber 11 in the first step and the second flow rate of the $NH_3$ gas supplied into the processing chamber 11 in the second step are not limited to the above-described examples. In order to obtain the effect of increasing the deposition rate in the first step and improving the film quality in the second step, it is preferable to set the difference between the first flow rate and the second flow rate to, for example, 100 sccm to 2000 sccm.

Further, in the above-described example, $NH_3$ gas is supplied only to R3 of the plasma forming regions R1 to R3, but $NH_3$ gas may be supplied to any of the plasma forming regions R1, R2, and R3 so as to perform nitriding, and $NH_3$ gas may be supplied to a plurality of plasma forming regions. When the $NH_3$ gas is supplied to the plurality of plasma forming regions of the plasma forming regions R1 to R3 in this manner, the first flow rate and the second flow rate are the total of the $NH_3$ gas supplied to the plurality of plasma forming regions. Further, among the plasma forming regions R1 to R3, the plasma forming region to which the $NH_3$ gas is supplied corresponds to the second region.

Although the illustration is omitted in order to prevent complication of description, in the above-described configuration example, in order to efficiently turn the $NH_3$ gas into plasma, $H_2$ gas may be supplied from the $H_2$ gas supply source 53 to the gas injector 43. Accordingly, the gas injector 43 may supply $NH_3$ gas and $H_2$ gas. That is, the $NH_3$ gas may be supplied into the processing chamber 11 alone, but may be supplied into the processing chamber 11 as a mixed gas obtained by mixing the $NH_3$ gas with another gas. The $NH_3$ gas does not have to be turned into plasma, but it is preferable to turn it into plasma for efficient nitriding.

In addition, the source gas is not limited to the DCS gas, and, for example, a gas containing silicon, such as hexachlorodisilane (HCD: $Si_2Cl_6$) gas or bis(tertiarybutylamino)silane (BTBAS) gas, may be used. It shall be understood that the embodiments disclosed herein are examples in all respects and are not restrictive. The above-described embodiments may be omitted, replaced, or modified in various forms without departing from the scope and spirit of the appended claims.

Hereinafter, evaluation tests performed in relation to the present technology will be described. As evaluation test 1-1, using the above-described film forming apparatus 1, the film formation was performed on a plurality of wafers W under the same processing conditions, except that the rotation speeds of the rotary table 12 were different. The rotation speed was changed within the range of 1 rpm to 10 rpm. Then, the deposition rates and the WERs for the formed SiN films were acquired.

Further, as evaluation test 1-2, using the above-described film forming apparatus 1, the film formation was performed on a plurality of wafers W under the same processing conditions, except that the flow rates of $NH_3$ gas supplied to the gas injector 43 were different from each other. The flow rates of the $NH_3$ gas were set to 400 sccm or 600 sccm. Then, the deposition rates and the WERs for the formed SiN films were acquired. In each of evaluation tests 1-1 and 1-2, the film formation was performed without changing the rotation speed of the rotary table 12 and the flow rate of $NH_3$ gas during the film forming process described in the above embodiments.

Figure 12:
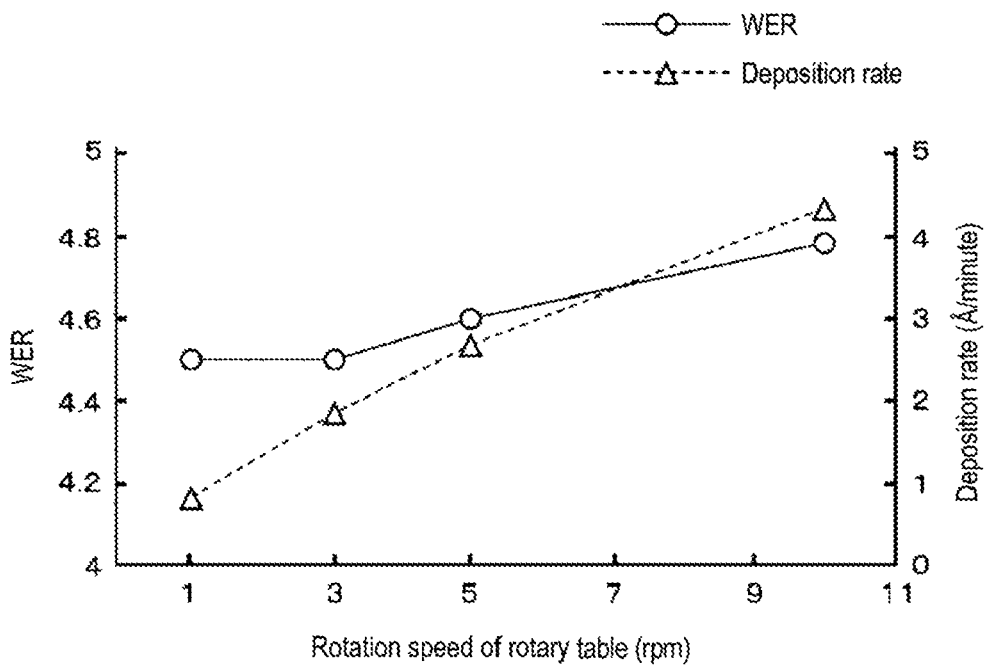
FIG. 12 is a graph representing results of an evaluation test.
Figure 13:
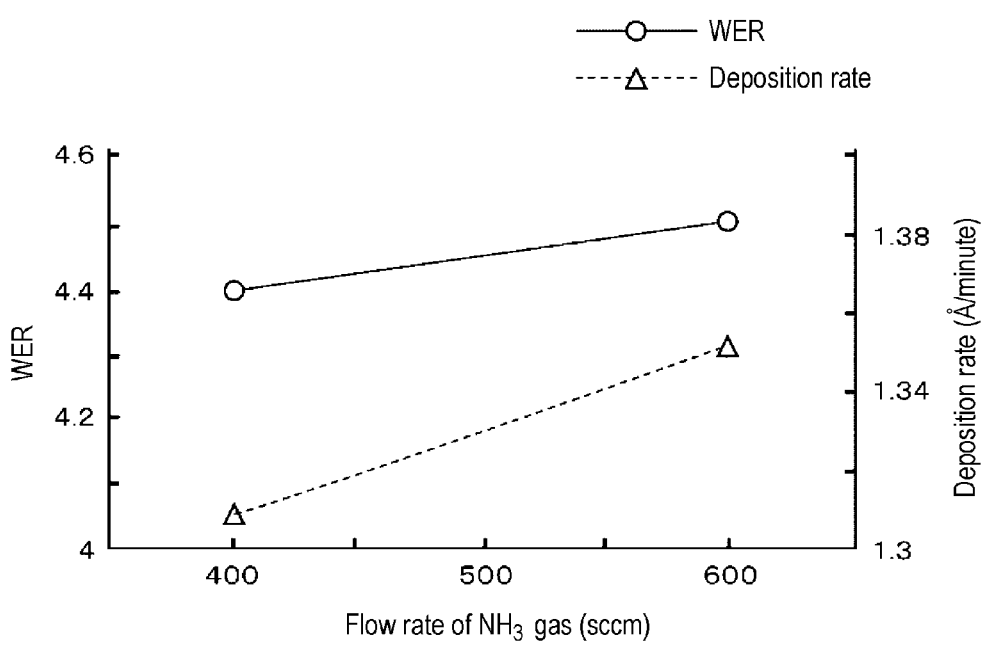
FIG. 13 is a graph representing results of an evaluation test.

The graphs of FIGS. 12 and 13 show the results of evaluation test 1-1 and evaluation test 1-2, respectively. The horizontal axis of the graph of FIG. 12 and the horizontal axis of the graph of FIG. 13 represent the rotation speed of the rotary table (unit: rpm) and the flow rate of $NH_3$ gas (unit: sccm), respectively. Further, each of the vertical axes of the graphs of FIGS. 12 and 13 represents the WER and the deposition rate (unit: Å/min) of a SiN film. In addition, each graph represents values standardized by applying the actually measured values of the WER of the SiN film to a calculation equation using the WER of a separately obtained thermal oxide film. As for the standardized values, like the measured values, a smaller value indicates that a SiN film is more difficult to etch and has a better film quality.

From the graph of FIG. 12, it can be seen that the WER and the deposit rate are increased as the rotation speed of the rotary table 12 is increased. Further, from the graph of FIG. 13, it can be seen that compared to the case where the flow rate of $NH_3$ gas is small, when the flow rate of $NH_3$ gas is large, both the WER and the deposition rate show high values. Accordingly, as described above, it can be seen that there is a trade-off between a low WER (good film quality) and a deposition rate, and that each of the WER and the deposition rate can be changed by changing each of the rotation speed of the rotary table 12 and the flow rate of NH$_3$ gas. Since the WER and the deposition rate are in a trade-off relationship as described above, the method of restrictively processing the portion where a low WER is required under the conditions where such a low WER is obtained as in the above-described embodiments is effective for suppressing the film forming time.

According to the present disclosure, it is possible to suppress a decrease in throughput when forming a silicon nitride film so as to fill a recess formed in the surface of a substrate and to suppress unnecessary etching after the formation of the silicon nitride film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
   rotating a rotary table to revolve a substrate which is placed on the rotary table and has a recess formed in a surface of the substrate;
   supplying a raw material gas containing silicon to a first region on the rotary table;
   supplying an ammonia gas to a second region which is spaced apart from the first region on the rotary table in a rotation direction of the rotary table and has an atmosphere partitioned from the first region;
   forming a first silicon nitride film in the recess by supplying the raw material gas to the first region and supplying the ammonia gas to the second region at a first flow rate, while the rotary table rotates at a first rotation speed; and
   forming a second silicon nitride film in the recess such that the second silicon nitride film is laminated on the first silicon nitride film by supplying the raw material gas to the first region and supplying the ammonia gas to the second region at a second flow rate smaller than the first flow rate, while the rotary table rotates at a second rotation speed smaller than the first rotation speed.

2. The film forming method of claim 1, wherein the ammonia gas is a plasmarized ammonia gas.

3. The film forming method of claim 2, wherein the first rotation speed is 10 rpm or more, and the second rotation speed is 2 rpm or less.

4. The film forming method of claim 3, wherein the second silicon nitride film has a thickness smaller than a thickness of the first silicon nitride film.

5. The film forming method of claim 1, wherein the first rotation speed is 10 rpm or more, and the second rotation speed is 2 rpm or less.

6. The film forming method of claim 1, wherein the second silicon nitride film has a thickness smaller than a thickness of the first silicon nitride film.

7. A film forming apparatus comprising:
   a rotary table configured to rotate so as to cause a substrate placed on the rotary table to revolve;
   a raw material gas supplier configured to supply a raw material gas containing silicon to a first region on the rotary table;
   an ammonia gas supplier configured to supply an ammonia gas to a second region which is spaced apart from the first region on the rotary table in a rotation direction of the rotary table and has an atmosphere partitioned from the first region; and
   a controller configured to output a control signal to perform:
      forming a first silicon nitride film in a recess formed in a surface of the substrate by supplying the raw material gas to the first region and supplying the ammonia gas to the second region at a first flow rate, while the rotary table rotates at a first rotation speed; and
      forming a second silicon nitride film in the recess such that the second silicon nitride film is laminated on the first silicon nitride film by supplying the raw material gas to the first region and supplying the ammonia gas to the second region at a second flow rate smaller than the first flow rate, while the rotary table rotates at a second rotation speed smaller than the first rotation speed.

* * * * *